(12) United States Patent
Karasawa

(10) Patent No.: US 6,425,477 B1
(45) Date of Patent: Jul. 30, 2002

(54) SUBSTRATE CONVEYANCE SYSTEM

(76) Inventor: Yasuto Karasawa, 5-4-26-204, Higashi-Gotanda, Shinagawa-ku, Tokyo 141-0022 (JP)

( * ) Notice: Subject to any disclaimer, the term of this patent is extended or adjusted under 35 U.S.C. 154(b) by 0 days.

(21) Appl. No.: 09/845,926

(22) Filed: Apr. 30, 2001

(51) Int. Cl.$^7$ ............................................... B65G 43/10
(52) U.S. Cl. .................. 198/575; 198/465.2; 198/860.3
(58) Field of Search ........................... 198/860.1, 860.2, 198/860.3, 860.4, 861.1, 580, 583, 575, 576, 577, 468.01, 465.1, 465.2, 341.02; 414/292, 318, 749

(56) References Cited

U.S. PATENT DOCUMENTS

| | | | |
|---|---|---|---|
| 4,483,654 A | * 11/1984 | Kock et al. | 414/744.5 |
| 5,195,866 A | * 3/1993 | Hasegawa et al. | 198/468.9 X |
| 5,437,359 A | * 8/1995 | Maruyama et al. | 198/464.3 |
| 5,906,262 A | * 5/1999 | Miki | 198/465.2 X |

* cited by examiner

*Primary Examiner*—James R. Bidwell
(74) *Attorney, Agent, or Firm*—Rosenthal & Osha L.L.P.

(57) ABSTRACT

A substrate conveyance system for transporting a substrate from a substrate source to either one of a plurality of substrate destinations. The substrate conveyance system is characterized by a combination comprising a first transfer module including substrate holding means for holding the substrate thereon and for changing orientation of the substrate, and a first housing surrounding the substrate holding means; and a second transfer module including a second housing which can be connected with the first housing, and transfer means in the second housing for transferring the substrate to or from said substrate holding means in the first housing which is connected with the second housing. Efficient interbay or intrabay transportation of substrates is enabled by arranging the combinations in a checkerboard form. In the arrangement, the combination is used as the minimum unit.

10 Claims, 8 Drawing Sheets

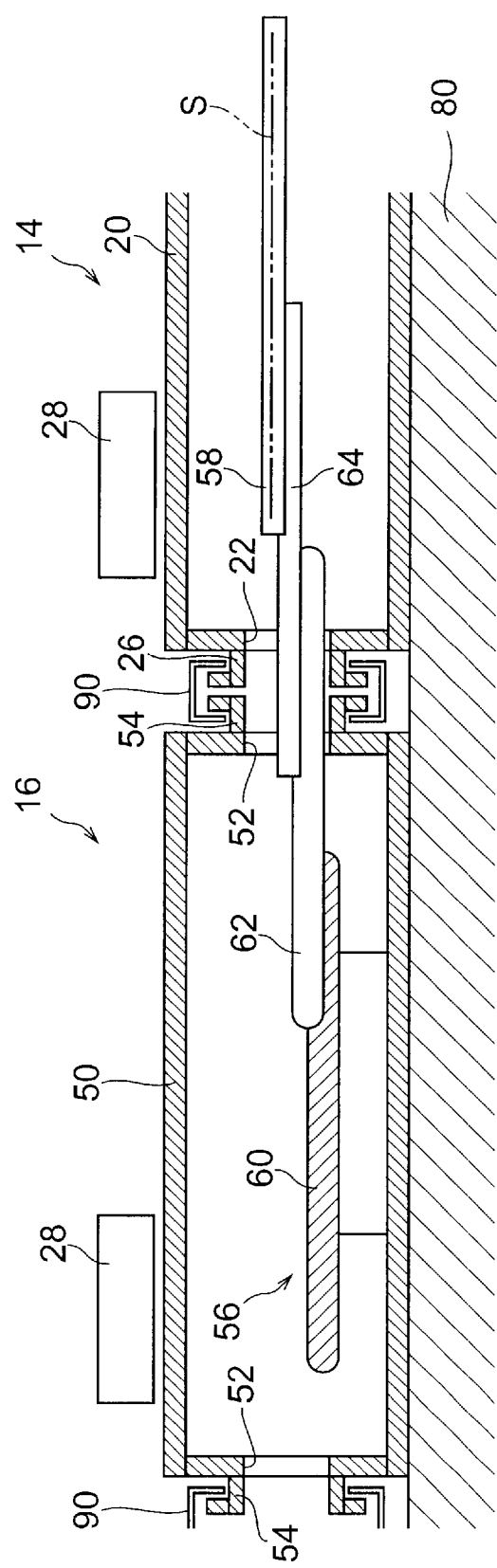

SUBSTRATE CONVEYANCE SYSTEM

BACKGROUND OF THE INVENTION

1. Field of the Invention

The present invention relates to a system that transports substrates for manufacturing flat panel displays, semiconductor devices or the like.

2. Related Background Art

In the plant for manufacturing flat panel displays or semiconductor devices, it is usual to group the same type of substrate processing apparatus such as CVD, PVD, and etching apparatus in a clean room to form a job shop or "bay" and transfer the substrates to be processed between the apparatus in each job shop (interbay transportation) or between the job shops (intrabay transportation).

Conventionally, a container or open cassette having an opening on one side or multiple sides and loaded with plurality (around 20 to 25) of substrates has been used for substrate transportation. The substrate transportation with the cassette is implemented manually, but manual substrate transportation faces a difficulty due to the recent substrate size increases in diagonal or diameter. As a result, automated guided vehicle and ceiling-track guided vehicle are used for interbay transportation and intrabay transportation, respectively.

The above-mentioned conventional substrate conveyance system performs cassette-based batch processing. Batch type transportation is effective as the number of processes is lower, but in the recent job shop type production lines where a small amount of diversified products are produced, substrates are rarely transferred to the identical substrate processing apparatus and cassette-based batch type transportation can produce substrates waiting for the subsequent step in each process. This will result in a large amount of WIP (Work in Process) from the viewpoint of overall manufacturing process. The WIP can push up the product price and also delay the time required for the whole production process.

Single substrate conveyance system has been taken into consideration so far to remove such an undesirable effect, but single-substrate type transportation performed with an automated guided vehicle or ceiling-track guided vehicle can complicate the vehicle's traveling routes with a control difficulty and requires a clean room size increase. The clean room size increase can cause a product cost increase. In addition, as the automated guided vehicle is operated at a slow speed, it is not appropriate for single substrate processing, and the ceiling-track guided vehicle has to be integrated with other transfer apparatus that performs substrate loading/unloading to and from the substrate processing apparatus, which is technically difficult.

Accordingly, it is an object of the present invention to provide a substrate conveyance system that can efficiently perform single-substrate type interbay transportation and/or intrabay transportation in the flat panel display fabrication lines or the semiconductor device fabrication lines and that can eliminate the need of a clean room.

SUMMARY OF THE INVENTION

To achieve the above-mentioned object, the present invention is characterized by a substrate conveyance system for transporting a substrate from one or more substrate sources to either one of a plurality of substrate destinations, comprising, in combination, a first transfer module including substrate holding means for holding the substrate thereon and for changing orientation of the substrate, and a first housing surrounding the substrate holding means; and a second transfer module including a second housing which can be connected with the first housing, and transfer means for transferring the substrate to or from the substrate holding means in the first housing which is connected with the second housing, the transfer means disposed inside said second housing.

With this arrangement, it is possible to form many branched substrate transport routes by properly arranging a number of combinations of the first and second transfer modules. In addition, the first transfer module can change the orientation or direction of substrate at the junction of substrate transfer routes, thereby enabling a free alteration of the substrate transfer direction. Further, it may be allowed that the substrate holding means has a substrate transfer function and the substrate transfer means has a substrate holding function. The arrangement of the first and second transfer module combinations is preferable when it is formed like a checkerboard.

Also, providing air purification or conditioning means for controlling the cleanliness of internal space of the first housing and/or that of the second housing can maintain a high level of cleanliness in space where substrates are transferred even in the environment with reduced cleanliness.

Preferably, the substrate holding means has a surface for mounting a substrate thereon and may be rotated about a center of the substrate mounted on the surface. This design can restrict the moment of rotations caused by a substrate load to a small value and can control a load of the rotating drive mechanism.

In case where substrate detection means for detecting substrate presence or absence is provided on each of the first and second transfer modules, it will be useful to recognize the position of the substrate being in transfer by allowing the identification of the substrate transport condition.

It will be also possible to remote control the orientation changes of the substrate holding means and the transfer system's driving in accordance with the signal sent from the substrate detection means, which will enable the management of the whole substrate conveyance system.

These and other features and advantages of the present invention will become apparent to those skilled in the art upon a reading of the following description when taken in conjunction with the drawings.

BRIEF DESCRIPTION OF THE DRAWINGS

FIG. 6 is a cross sectional view taken on line VI—VI in FIG. 4.

DESCRIPTION OF THE PREFERRED EMBODIMENTS

Figure 1:
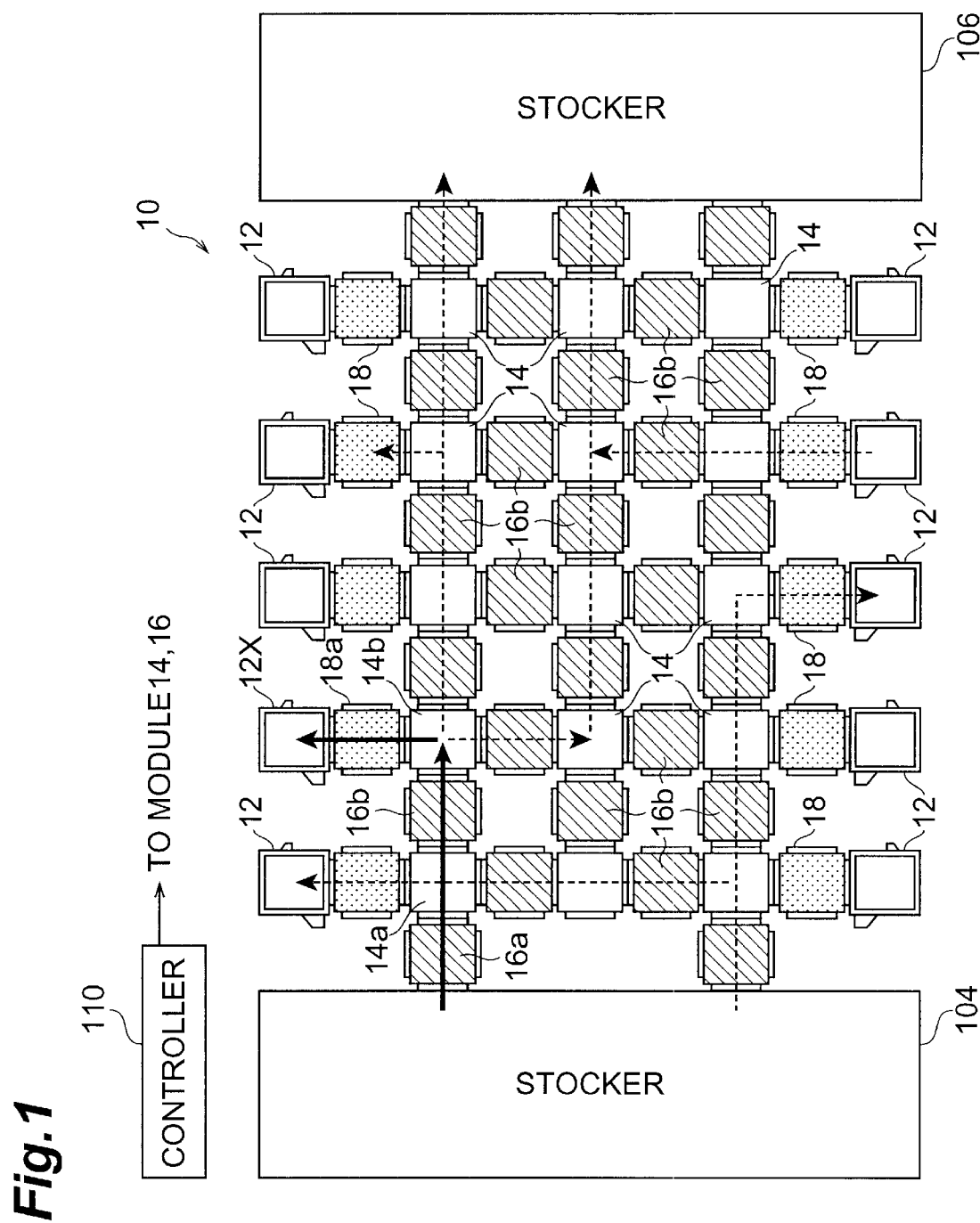
FIG. 1 is a view schematically showing one embodiment of the substrate conveyance system of the present invention.

Referring to the drawings, there is shown a preferred embodiment of the present invention. In the following description, like reference characters designate like or corresponding parts throughout the views.

FIG. 1 shows an embodiment of the substrate conveyance system according to the present invention. The shown substrate conveyance system 10 is used to perform single-substrate type transportation in the job shop that is arranged with substrate processing apparatus 12 including a plurality of CVD apparatus, etching apparatus or the like. Note that this embodiment handles glass substrates in a rectangular shape, which are to be flat panel displays as a final product.

The substrate conveyance system 10 shown in FIG. 1 basically comprises the three types of transfer modules 14, 16 and 18. The first transfer module 14 is mainly used to perform substrate orientation changes, and the second transfer module 16 functions to transfer a glass substrate to or from the first transfer module 14. The both modules 14 and 16 are arranged side by side in a checker board form. The third transfer module 18 is used to transfer a glass substrate between the first transfer module 14 and the substrate processing apparatus 12. Next, the construction of each of the transfer modules 14, 16 and 18 is explained in detail.

Figure 2:
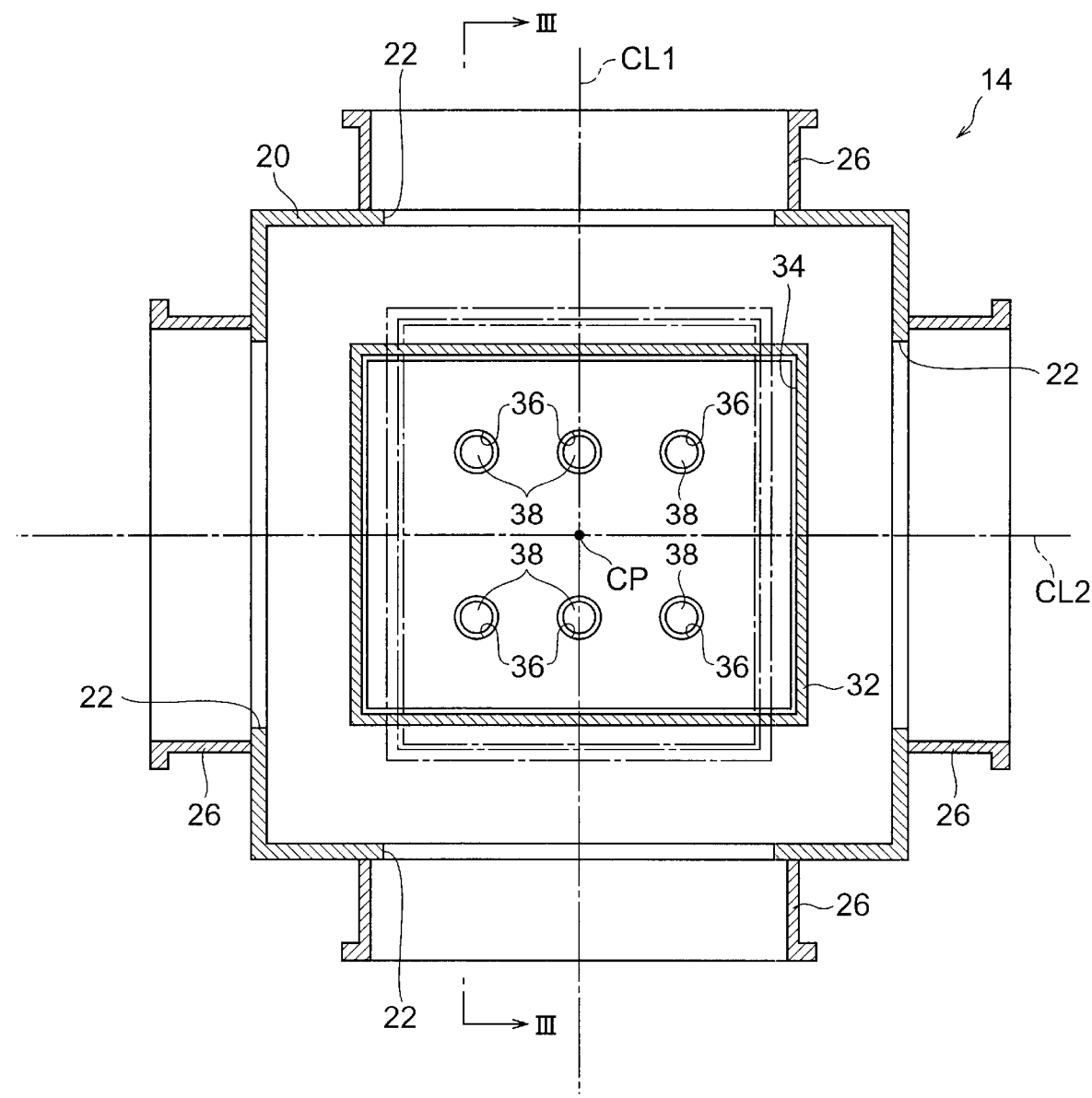
FIG. 2 is a horizontal sectional view of the first transfer module used with the substrate conveyance system in FIG. 1.
Figure 3:
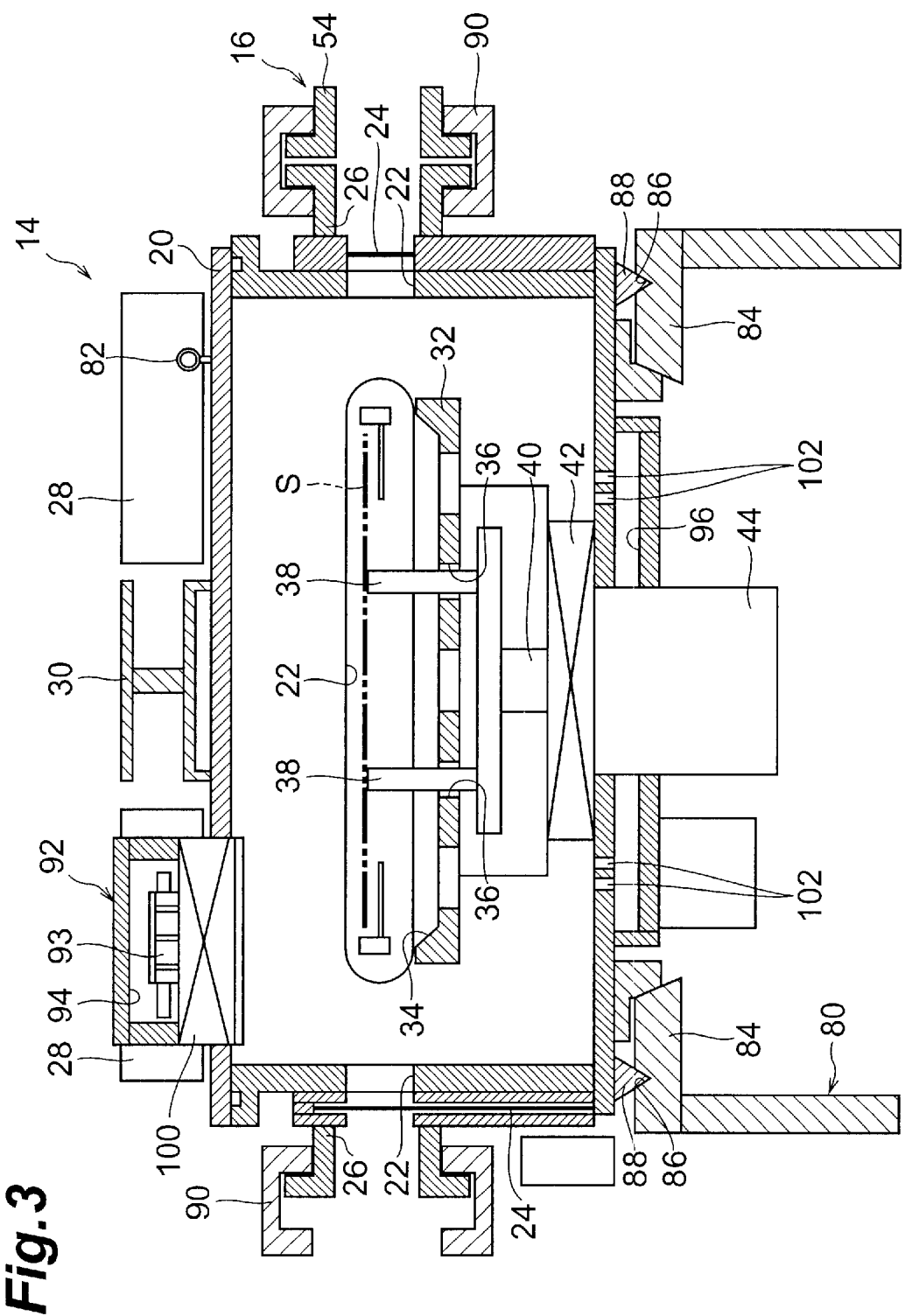
FIG. 3 is a vertical sectional view taken on line II—II in FIG. 2.

FIG. 2 is a horizontal sectional view showing the first transfer module 14 and FIG. 3 is a cross sectional view taken on line III—III of FIG. 2. As shown in FIGS. 2 and 3, the first transfer module 14 comprises a housing 20. In the shown embodiment, the housing is substantially in the outward form of a rectangular parallelepiped with an almost square in horizontal cross section. The housing has openings 22 provided in the sides thereof. The openings 22 is for connecting between the housing 20 and a housing of the adjacent transfer module 16 or 18 to provide an internal linkage. The openings 22 have a size and shape required to transfer the glass substrate S between the modules and the shape of the shown opening 22 is substantially elliptic or rectangular. In each openings 22, a gate valve 24 (shown only in FIG. 3) is preferably provided for opening and closing the opening 22. For example, when a gas leakage occurs in the associated module 14, the gate valve 24 may seal the interior of the housing 20 if necessary. In addition, flanged fittings 26 are provided on the outer surface of the housing 20 surrounding the openings 22 for an easier connection with the adjacent module. The line CL1 joining the centers of the openings 22 facing to each other and the line CL2 joining the centers of the other openings 22 facing to each other intersect at a right angle. The crossing point CP between the lines CL1 and CL2 is positioned on the center axis extending in vertical direction of the housing 20. If the relationship between the openings 22 and the vertically extending center axis of the housing 20 is remained the same as aforementioned, the shape or form of the housing 20 will not be restricted to the shown embodiment. Also, it will be preferable that the housing 20 is made of the material with high stiffness such as a steel, as attachments such as a pneumatic air supply unit or a drive control unit 28 for the associated modules 14, and a walking step 30 may be installed on top of the housing 20.

In the interior of the housing 20, a platform (substrate holding means) 32 comprising a substantially rectangular flat panel for mounting the glass substrate S is positioned horizontally. The upper surface of the platform 32 is slightly larger than the glass substrate S and has a concavity 34 provided therein. The shape of the concavity 34 is substantially same as the substrate S. The sidewall surface of the concavity 34 is outwardly tilted in an upward direction so as to facilitate the reception of glass substrate S therein and the automated alignment of the glass substrate S to the platform 32. As the glass substrate S is of an insulator and tends to be charged easily, it will be preferred to take some static eliminating means (not shown) such as grounding to discharge static electricity on the platform 32. In addition, it will be effective for automated substrate transfer control if a suitable substrate detecting means (not shown) for detecting the presence or absence of the glass substrate S on the platform 32 is provided thereon.

A plurality (six in this embodiment) through-holes 36 are formed at the predetermined locations of the concavity 34 in the platform 32. Lift pins 38 are inserted through the holes 36 from below the platform 32 for lifting the glass substrate S from the concavity 34 and lowering the substrate S onto the bottom surface of the concavity 34. The lift pins 38 operate vertically by the lift pin drive mechanism 40 which is fixed on the lower surface of the platform 32.

The lower surface of the casing of the lift pin drive mechanism 40 is supported at the bottom of the housing 20 through a rotation support mechanism 42. Also, a pneumatically rotating motor or an electric motor 44 is attached at the bottom of the housing 20, and the driving shaft of the motor 44 is connected with the lower surface of the casing of the lift pin drive mechanism 40. A radial-thrust bearing, for example, maybe used as the rotation support mechanism 42. The radial-thrust bearing has preferably a seal to maintain air-tight between the casing of the drive mechanism 40 and the bottom of the housing 20. The rotational center axis of the rotation support mechanism 42 and the driving shaft of the motor 44 correspond to the vertical axis of the housing 20, and the center point (CP) of the platform 32 (the center point of the bottom surface of the concavity 34, to be precise) is disposed on the rotational center axis.

In the above-mentioned configuration, controlling the motor 44 can rotate the lift pin drive mechanism 40 and eventually the platform 32. In this embodiment, rotation is performed in both normal and reverse directions between the solid line position and the chain double-dashed line in FIG. 2, within the range of 90 degrees. As a result, it will be possible to selectively face the shorter side of the platform 32 to either pair of the openings 22 facing to each other. Since the center of the glass substrate S disposed inside the concavity 34 of the platform 32 and the rotating center of the platform 32 substantially correspond to each other, the moment acted to the substrate S and the platform 32 will be small. Accordingly, a rotating movement will be performed smoothly, and there will be no excessive load applied on the rotating support mechanism 42. This will prevent abrasion and restrict the generation of particles. In recent years, flat panel displays tend to be increased in size and the glass substrate S is quite heavy, the effects will be extremely useful. It will be desired to reduce the volume of the housing 20 as minimum as possible, while the dimensions and shape thereof will not hinder the rotation of the platform 32.

Figure 4:
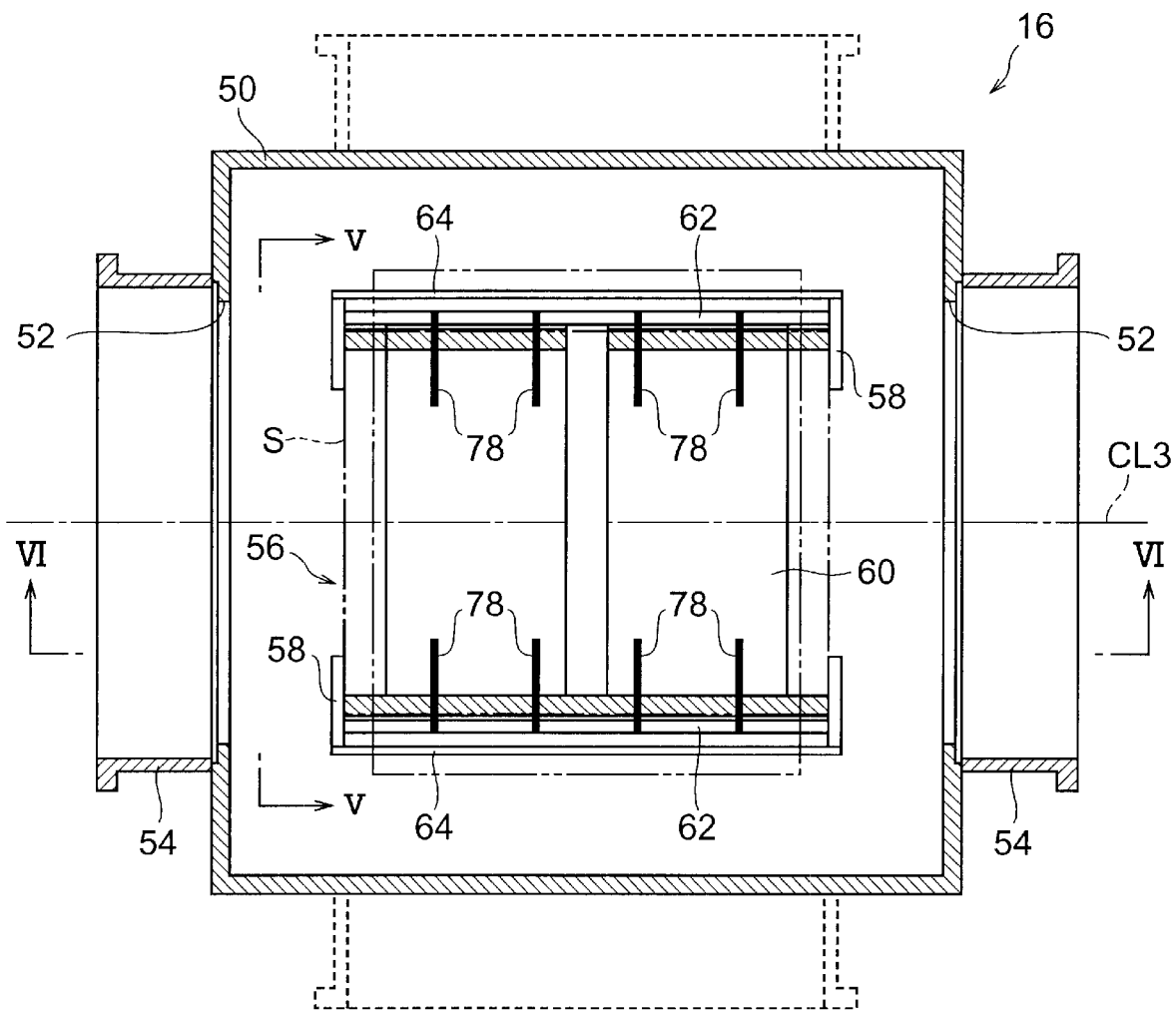
FIG. 4 is a horizontal sectional view of the second transfer module used with the substrate conveyance system in FIG. 1.
Figure 5:
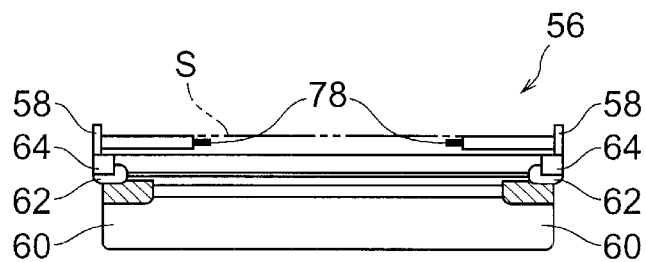
FIG. 5 is an arrow showing view taken on line V—V in FIG. 4.

FIG. 4 is a horizontal sectional view showing the second transfer module 16 and FIG. 5 is a view taken in the direction of the allows along line V—V of FIG. 4. As it will be obvious from FIGS. 4 and 5, the second transfer module 16 has the housing 50 which is basically similar to the housing 20 of the first transfer module 14. The openings 52, however, are provided on only a pair of the sides facing to each other and are not provided on the other sides. Consequently, flanged fittings are provided on the sides in which the openings 52 are formed. As shown with dashed lines in FIG. 4, the openings maybe formed on the other sides so the glass substrate S can be transferred through them. This point will be discussed later. A gate valve is not provided in the opening 52 of the housing 50 because the gate valve mechanism 24 of the first transfer module 14 can be used in common. As a matter of course, it is possible to provide agate valve mechanism in the second transfer module 16 to omit the gate valve mechanism for the first transfer module 14.

A transfer apparatus or transfer means 56 for receiving the glass substrate S from the first transfer module 14 and handing off the substrate S to a different first transfer module 14 is disposed inside the housing 50. The transfer apparatus 56 can move the support bars 58 for supporting the glass substrate S along a horizontal straight line, transfer the substrate into the adjacent first transfer module 14 through the opening 52, and transfer the glass substrate 32 onto the platform 32 by means of the lift pins 38.

There may be a variety of transfer apparatus 56 with the above-mentioned functions, but the transfer apparatus 56 of the illustrated embodiment utilizes the expansion mechanism. In more detail, the shown transfer apparatus 56 has a rectangular base plate 60 which is disposed in the center of the interior of the housing 50, as it is obvious from FIG. 6 which is a cross sectional view taken on line VI—VI of FIG. 4. A pair of edges facing to each other on the base plate 60 are located in parallel with the straight line CL3 joining the centers of openings 52. At least single-staged guide rail, but two-staged guide rails 62 and 64 in the shown embodiment are located along these edges. Also, the support bars 58 are located on the guide rails 64. The base plate 60 and the guide rail 62, the guide rails 62 and 64, and the guide rail 64 and the support bar 58 are slidably connected in parallel with the center line CL3, respectively. It is effective if a dust-proof bearing ball (not shown) treated with Teflon or other material is provided between these parts 58 to 64 for sliding smoothness and prevention of particles generated by abrasion. With this arrangement, when horizontally moving the guide rails 62 and 64 and the support bars 58 from the initial position, it is possible to set the support bars 58 at the position that is drastically offset from the base plate 60. Also, the support bars can be offset likewise to an opposite direction as well.

Figure 7A:
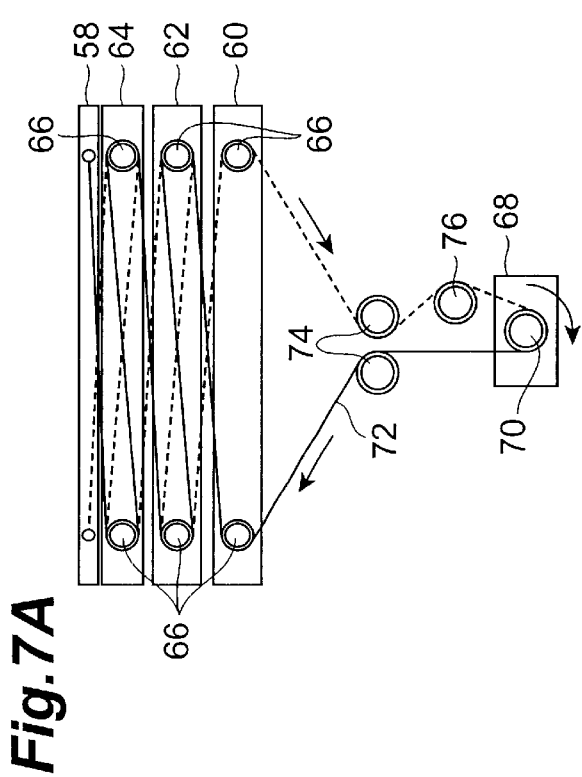
FIG. 7A is a side view schematically showing a drive mechanism of the substrate transfer apparatus of the second transfer module, showing the initial state of the drive mechanism.
Figure 7B:
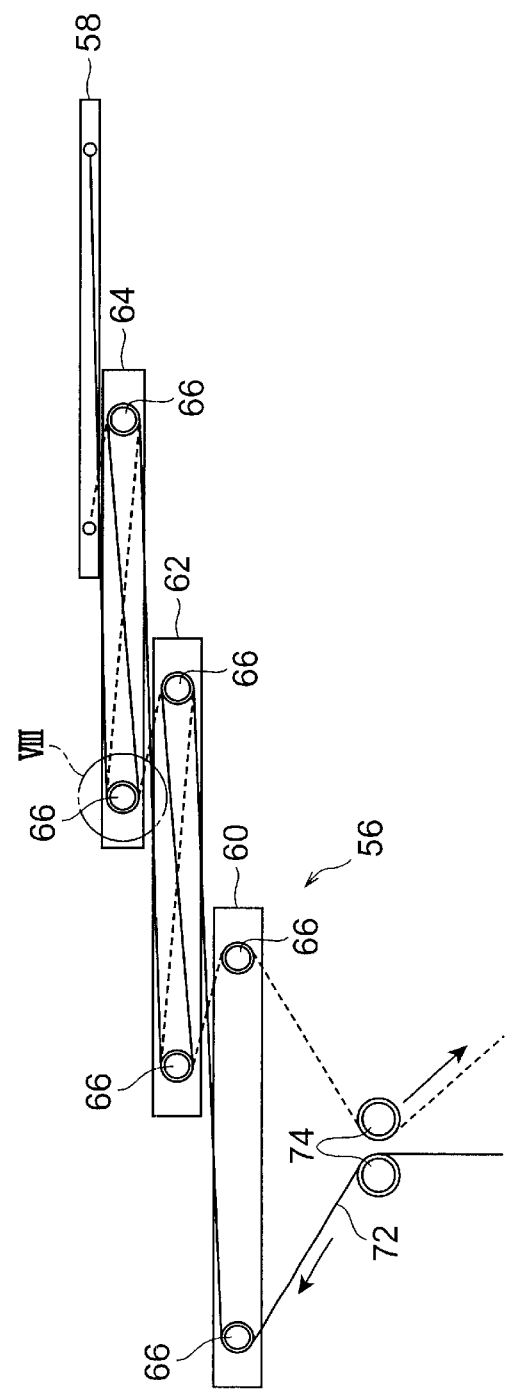
FIG. 7B is a side view schematically showing a drive mechanism of the substrate transfer apparatus of the second transfer module, showing the state at which the support bars are shifted.
Figure 8:
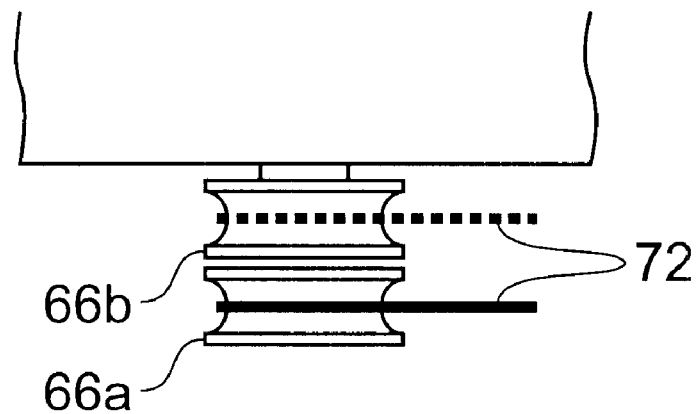
FIG. 8 is a plan view of part of VIII shown in FIG. 7.

A rack-and-pinion may be used as a component of the drive mechanism for the guide rails 62, 64 and the support bars 58, but the drive mechanism with a superior dust-proof performance preferably uses pulleys and wires. FIGS. 7A and 7B are views conceptually showing the drive mechanism with pulleys and wires. Pulleys 66 are attached on the outer side surfaces of the base plate 60 and the guide rails 62 and 64 near outer ends thereof. As clearly shown in FIG. 8, each of the pulleys 66 attached on the guide rails 62 and 64 comprises two pulleys 66a and 66b which are coaxially connected to each other such that they can rotate individually. A wire 72 is applied as illustrated around these pulleys 66 and the pulley 70 on the rotating shaft of the motor 68 which is disposed below the base plate 60, and the ends of the wire 72 are connected to the ends of the support bar 58, respectively. In FIGS. 7A, 7B and 8, the part of wire 72 that runs around the pulleys 66a positioned at the front side of the drawing are illustrated with solid lines and the part of wire 72 that runs around the pulleys 66b positioned at the back of the drawing are illustrated with dotted lines. In this embodiment, pulleys 74 are used for the wire 72 to change its direction and a pulley 76 is used to apply a tension on the wire 72. Dust-proof steel wire is preferable for the wire 72 and it is also preferable if the pulleys 66, 70, 74, and 76 are also dust-proof.

With this arrangement, for example, when the rotating shaft of the motor 68 rotates to the direction of an arrow as shown in FIG. 7A, the guide rails 62 and 64 and the support bars 58 move from the initial position in FIG. 7A to the right as shown in FIG. 7B. When the motor 68 goes into reverse, the support bars 58 will move to the left (not shown). When the support bars 58 are shifted to the most projected position, the support bars 58 can go through the opening 52 and come out from the second transfer module 16. Then, the support bars 58 is located above the platform 32, where the first transfer module 14 is connected with the corresponding opening 52 of the second transfer module 16 (see FIG. 6).

There are two support bars 58 and they are arranged in parallel with each other. A plurality of claws 78 are provided on the inner edges of the support bars 58 so that the glass substrate S can be mounted thereon and supported thereby. Consequently, when the support bars 58 are slid and inserted into deep inside the first transfer module 14, the glass substrate S supported by the support bars 58 will be positioned above the platform 32 and the center of the glass substrate S will be positioned on the vertically center axis (CP) of the platform 32. It is preferable to provide a detector (not shown) for detecting presence/absence of the glass substrate S on the support bars 58.

The third transfer module 18 is used for transferring the glass substrate S between the first transfer module 14 and the substrate processing apparatus 12. The transfer module 18 may have various constructions or arrangements in conjunction with the substrate processing apparatus 12, but the module 18 in this embodiment is similar to the second transfer module 16, in which a detail description of the module 18 will be omitted. A vacuum pump (not shown) is connected to the third transfer module 18 to enable loading or unloading of the glass substrate S into or from the substrate processing apparatus 12 without opening the apparatus 12 to atmosphere and to reducing internal pressure in the module 18. A gate valve is provided in the opening between the third transfer module 18 and the substrate processing apparatus 12. As the opening to the first transfer module 14 is sealed by the gate valve mechanism 24 of the first transfer module 14, there is no need to provide a gate valve mechanism in the opening.

As clearly shown in FIG. 3, these trans fermodules 14, 16, and 18 may be mounted on a mounting frame 80 which is installed on the factory floor between the substrate processing apparatus 12. When mounting the transfer modules, it is useful to use eyebolts 32 on the housing of each transfer module for lifting the module by a crane. Since the transfer modules 14, 16, and 18 are thermally expanded and contracted, the whole substrate conveyance system 10 may be dislocated. So, it is preferable that the frame 80 has rails 84 extending to one direction, and that grooves 86 are formed of the rails 84, and that projections 88 provided on the bottom of each transfer module housing are fitted in the grooves 86 to permit small travel of the transfer modules. Also, the grooves 86 and the projections 88 can facilitate positioning of the modules.

With respect to the arrangement of the transfer modules 14, 16, and 18, the third transfer module 18 is positioned such that one of the openings of the housing is connected with the opening of the substrate processing apparatus 12. Also, one of the openings 22 of the first transfer module 14 is connected with the other opening of the third transfer module 18. The second transfer module 16 is typically connected with the first transfer module(s) 14, as a result, the first and the second transfer modules 14 and 16 are arranged in a diced-pattern or checkerwise. It is preferable that a gasket 90 of elastic material is inserted between the flanged fittings 26 and 54 in consideration of thermal expansion and contraction for the connection between modules. Expandable fittings of a bellows structure may be used.

An appropriate air conditioning system or air purification means is connected to the transfer module(s) to keep the cleanliness of the interiors of the continuous housings 20 and 50 to a clean room level or higher. As shown in FIG. 3, it is preferable that a closed-loop air filtration system 92 mainly including a HEPA (High Efficiency Particulate Air) filter or an ULPA (Ultra Low Penetration Air) filter is installed on each of the transfer modules 14, 16, and 18. The closed-loop air filtration system 92 as illustrated in FIG. 3 comprises an air chamber 94 located on the upper surface of the module housing, an air chamber 96 located on the lower surface of the housing, and an air path (not shown) through which the air chambers 94 and 96 are communicated with each other. When a circulating fan 98 disposed inside the air chamber 94 is operated, clean air filtered through an air filter 100 flows from the upper portion of the housing 20 toward the lower portion of the housing 20, then the air taken into the air chamber 96 through the small holes on the lower portion of the housing is circulated into the air chamber 94 through the air path.

Reference characters 104 and 106 in FIG. 1 designates an inlet and an outlet of the substrate conveyance system 10, respectively, and to be concrete, they are stockers or stock-chambers for storing the glass substrates S therein. Inside the stockers 104 and 106, a transfer robot, not shown, enables a hand-off of the glass substrate S to and from the support bars 58 which is inserted into the stockers 104 and 106 from the second transfer module 16.

Now, the operation of the substrate conveyance system 10 arranged as described will be explained particularly.

First of all, the whole substrate conveyance system 10 is started up, whereupon, in this embodiment, the gate valves 24 open all the openings 22 of the first transfer module 14, and the gate valves (not shown) in the openings of the substrate processing apparatus 12 and the stockers 104 and 106 are closed. The gate valves 24 may be normally closed and opened only at the time of substrate passing, but in this embodiment, the gate valves are explained as a normally open type which is open during normal operation.

When the substrate conveyance system 10 is started up, the air conditioning system or air filtration apparatus 92 which are installed exclusively to the associated transfer modules 14, 16 and 18 and an air conditioning system used in common with the substrate conveyance systems are operated, and the interior of the substrate conveyance system 10 will be cleaned to a predetermined level of cleanliness. Since the volume of internal space of the substrate conveyance system 10 is quite small in comparison with the clean room in the conventional factory, internal cleanliness will be maintained sufficiently high even if the power to the air conditioning system is low.

Then, the gate valves in the outlet of the stocker 104 are opened to communicate the stocker 104 with the adjacent second transfer module 16. Then, the drive motor 68 of the substrate transfer apparatus 56 of the second transfer module 16 is controlled so as to move the support bars 58 into the stocker 104, where the glass substrate S to be treated is loaded onto the claws 78 of the support bars 58 by the transfer robot. Thereafter, the drive motor 68 is reversely operated to contract and return the support bars 58 and the guide rails 62 to the initial position where the center of the glass substrate S is substantially coincided with the center of the base plate 60, and the motor 68 is stopped to wait for processing. At this position, since the bending moment is not applied to the support bars 58 and the guide rails 62 and 64, a load applied to the substrate transfer apparatus 56 will be drastically reduced.

Now, it is assumed that the substrate processing apparatus to process the said substrate S is one that is designated by a reference character 12X in FIG. 1, for example. In this condition, the substrate transfer route to the substrate processing apparatus 12X is determined as shown with solid arrow lines in FIG. 1, and the driving systems of the transfermodules 14, 16, and 18 on the substrate transfer route are be controlled in order.

That is to say, the substrate transfer apparatus 56 of the second transfer module 16*a* is driven first to move the support bars 58 into the first transfer module 14*a*. At this time, the shorter side of the platform 32 of the first transfer module 14*a* faces to the second transfer module 16*a*, and the lift pins 38 are located below the top surface of the platform 32 so that they will not hinder the insertion of the glass substrate S. When the center of the glass substrate S reaches to the vertical center axis of the platform 32, the operation of the substrate transfer apparatus 58 stops, the lift pins 38 are lifted up, and the glass substrate S is carried on the tips of the lift pins 38. Then, the substrate transfer apparatus 58 of the second transfer module 16*a* returns to the initial position and the lift pins 38 are lowered below the platform 32, whereby the glass substrate S is fit into the concavity 34 of the platform 32 and supported on the bottom surface of the concavity 34. As mentioned earlier, the sidewall surface of the concavity 34 is inclined. As a result, even if the position of the glass substrate S is laterally displaced, the edges of the glass substrate S is guided by the sidewall surface and the substrate S is automatically adjusted to a normal position.

Then, to move the glass substrate S to the next second transfer module 16*b*, in reverse with the above-mentioned order, the lift pins 38 are lifted up, the support bars 58 of the substrate transfer apparatus 56 of the next second transfer module 16*b* are inserted into the first transfer module 14a, the lift pins 38 are lowered, thereby the glass substrate S is carried on the support bars 58. When the glass substrate S is supported by the support bars 58, the motor 68 of the transfer apparatus 56 rotates into reverse to move the glass substrate S onto the platform 32 of the next first transfer module 14*b* as explained in the previous procedure.

When the glass substrate S is set on the platform 32 of the first transfer module 14*b*, the motor 44 is driven to turn the platform 32 at 90 degrees, whereby the shorter side of the platform faces the third transfer module 18*a*. Then, the lift pins 38 are lifted, the support bars of the transfer apparatus for the third transfer module 18*a* are inserted into the first transfer module 14*b*, and the lift pins 38 are lowered to move the glass substrate S onto the support bars. When the glass substrate S is held by the support bars, the motor of the transfer apparatus of the third transfer module 18*a* goes into reverse to return the support bars to the initial position. In addition, the gate valve of the first transfer module 14*b* are closed to close the opening between the third transfer module 18a and the first transfer module 14b, and the vacuum pump connected to the third transfer module 18a is operated to reduce the internal pressure of the third transfer module 18a. When the pressure in the third transfer module 18a is reduced to a predetermined degree of vacuum, the gate valve of the substrate processing apparatus 12X is opened and the transfer apparatus is operated to load the glass substrate S onto the substrate support (not shown) inside the substrate processing apparatus 12X.

After processing the said glass substrate S in the substrate processing system 12X, the substrate S is transported to another substrate processing apparatus for the subsequent treatment, or alternatively, to the stocker 106 to be transported to a different job shop. The operation of each of the transfer modules 14, 16, and 18 for this purpose is not explained here, but it will be easily understood from the foregoing description to those skilled in the art. In addition, it will be apparent that the suitable combination of the above-mentioned operations will enable a free movement of the glass substrate S as shown with dotted arrow lines in FIG. 1. It is preferable that the glass substrate S is traveled along the central line, i.e. a main substrate transport route after completion of all substrate processing. Because, there will be less stagnation of glass substrates S in the main route and there may occur some unprocessed substrates waiting for processing in the line adjacent to the substrate processing apparatus. When occurring such waiting, it is desirable to separate a line for the processed substrate and a line for the unprocessed substrates to enhance efficient substrate transportation.

To simplify the explanation, the above-mentioned procedure is explained for the case of a single glass substrate S. In case where a plurality of glass substrates S are continually sent from the stocker 104 and those glass substrates S are present inside the substrate conveyance system 10 at the same time, the operation procedure is the same with the case for a single glass substrate as a basic rule. The manual control of transporting of multiple glass substrates S is not practical, however, and the whole remote control using the controller 110 may be implemented.

The controller 110 receives a signal, which is sent from the detector located on each of the transfer modules 14, 16, and 18, indicating the presence or absence of the glass substrate S and controls the substrate transport procedure while identifying the position of the glass substrate S. If an ID number is attached to each of the glass substrate S sent from the stocker 104 and an address is given to each of the transfer modules 14, 16, and 18, implementation of efficient substrate transport and production plans will be enabled. In this case, the tact time based synchronous substrate transport system or the asynchronous substrate transport system in which the flow of the substrate S is prioritized may be employed.

The preferred embodiment of the present invention is explained in detail so far, but it should be understood that the present invention is not limited to the afore-mentioned embodiment and is specified by the claims.

For example, it is possible to provide heating or cooling means inside the housing of each transfer module to implement a preheating treatment before substrate processing. Vacuum means may be added to reduce the internal pressure of each transfer module.

Figure 9:
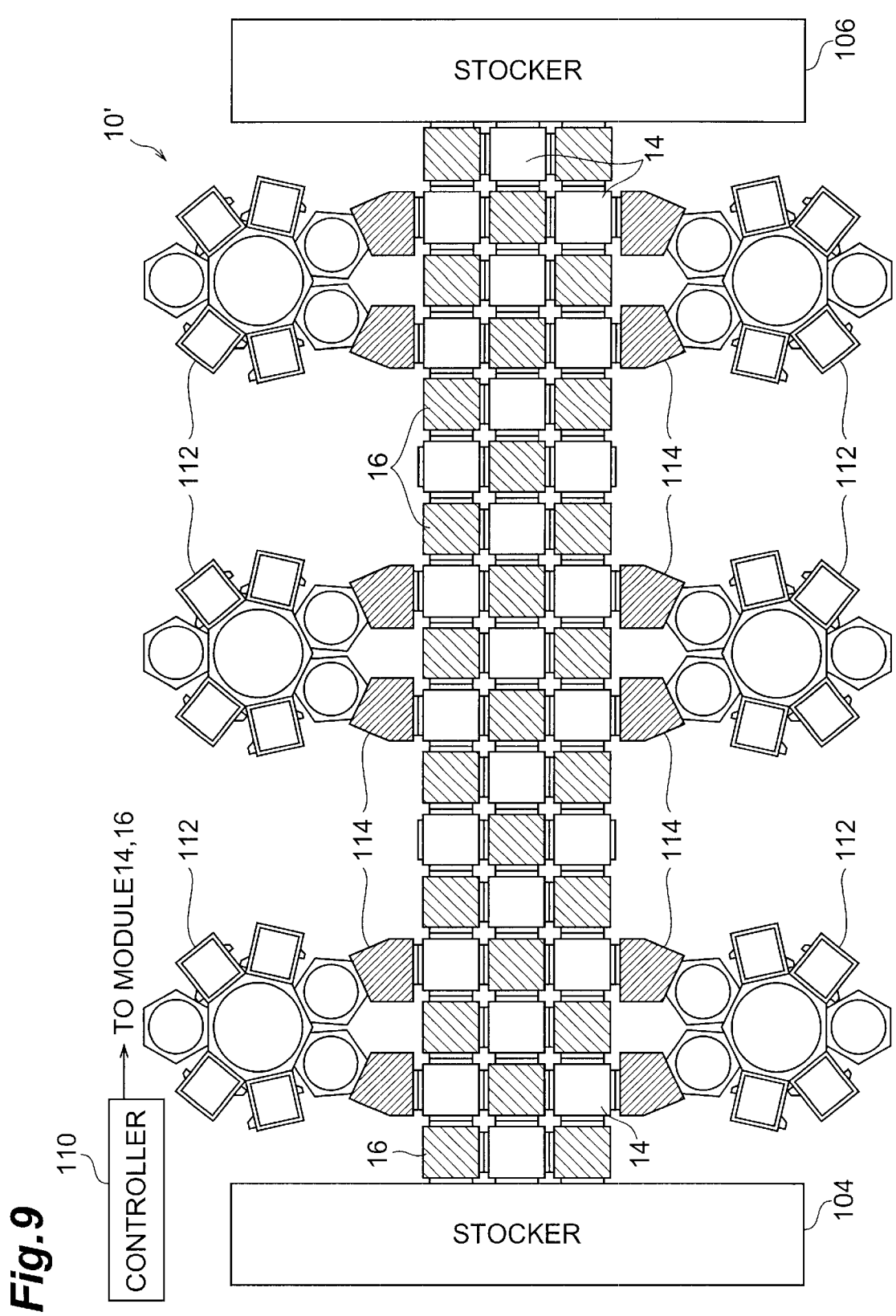
FIG. 9 is a schematic view showing another embodiment of the substrate conveyance system of the present invention.

In addition, the substrates used for transport are not limited to the glass substrate for manufacturing flat panel displays. The substrate conveyance system of the present invention is applicable to semiconductor substrates for fabrication of semiconductor devices as an example. FIG. 9 is an example of the substrate transport system 10' used for semiconductor substrates.

In the system configuration shown in FIG. 9, the substrate processing apparatus 112 as a destination to which substrates are transported are a cluster tool or of a multi-chamber architecture, and are equipped with loadlock chambers 114. Consequently, there is no need to provide vacuum means in the third transfer module 18, and means for loading/unloading the substrate with respect to the loadlock chambers 114 will be modified. As a semiconductor substrate is round in shape, the shape and the configuration of the platform 32 and the support bars 58 for the transfer apparatus 56 will be modified to some extent. Especially, the support bars 58 for the transfer apparatus 56 of the second transfer module 16 may be replaced with a so-called fork-type blade.

As a semiconductor substrate is lighter than a glass substrate, it is also possible to move the substrate to four directions by enabling a horizontal rotation of the transfer apparatus 56. In this case, the openings 22 are formed at the locations that are shown by the dash line. The arrangement as shown in FIG. 9 is a reflection thereof. This arrangement includes three rows of tranportation lines, enabling the substrate transfer performance that is equal to that of the 5-row arrangement as shown in FIG. 1. This is applicable of course to the transport of glass substrates. In addition, there is no need of providing housing openings at an interval of ninety degrees, and for example, it is also possible to combine the modules in a honeycomb form by forming the openings to six directions.

The above-mentioned embodiment of the present invention is explained for interbay transportation, but the present invention is applicable to intrabay transportation.

As mentioned above, the present invention is characterized by the technology to multiply the substrate transport routes to enable a free selection of substrate transport directions. Consequently, joining and separating the substrate flows will be performed easily and it will be also possible to transfer the substrate through a different route if a fault occurs in a certain transfer module.

Since the conveyance apparatus according to the present invention is employed with a single substrate transporting system, together with the multiplied transport routes as mentioned, the way of substrate transport to multiple substrate processing apparatus will be diversified as well, contributing to the reduction of WIPs, and the present invention is fit to the job shop type production lines where a small amount of diversified products are produced. In addition, there will be no need of restricting the substrate processing apparatus to be connected to the substrate conveyance system to identical types, and there will be more freedom in facility layout for the conventional concepts of interbay and intrabay transportation can be eliminated.

Modular design of the substrate conveyance system will enhance the freedom of installation layout of the system itself and will ease the installation work.

In addition, as each of the internal transfer modules is airtight, a need of constructing a clean room in the substrate processing factory will be reduced or removed. As it is easy to maintain a high level of cleanliness in a narrow airtight space, there will be the advantages of drastic particulate reduction and enhancement of product quality and yield.

From the above observation, the present invention will be effective and contribute to the product cost reduction as well.

Moreover, the present invention will enable the employment of cluster tools for the whole substrate processing factory and will enhance a further integration of substrate processes. Since the substrate conveyance system of the present invention can transport large sized substrates with an increased diameter or diagonal, it is expected to contribute to the development of new apparatus or facilities which will replace the current cluster tools (single-substrate, multi-chamber substrate processing apparatus in which the transfer robot is situated in the center with surrounding substrate processing apparatus) that are concerned to be enlarged with the increase of substrate sizes.

What is claimed is:

1. A substrate conveyance system for transporting a substrate from one or more substrate sources to either one of a plurality of substrate destinations, comprising, in combination:

a first transfer module including substrate holding means for holding the substrate thereon and for changing orientation of the substrate, and a first housing surrounding said substrate holding means; and a second transfer module including a second housing which can be connected with said first housing, and transfer means for transferring the substrate to or from said substrate holding means in said first housing which is connected with said second housing, said transfer means disposed inside said second housing.

2. A substrate conveyance system as claimed in claim 1, wherein there are plurality of said combinations, and wherein said first transfer modules and said second transfer modules are arranged in a checkerboard form.

3. A substrate conveyance system as claimed in claim 1, further comprising air purification means for adjusting the cleanliness of internal space of said first housing and/or said second housing.

4. A substrate conveyance system as claimed in claim 3, wherein said air purification means is provided on each of said first housing and said second housing.

5. A substrate conveyance system as claimed in claim 1, wherein said substrate holding means includes a surface to mount a substrate thereon, said substrate holding means being able to be rotated about a center of the substrate mounted on said surface.

6. A substrate conveyance system as claimed in claim 5, wherein said substrate holding means includes lift pins to lift a substrate from said surface.

7. A substrate conveyance system as claimed in claim 6, wherein said transfer means includes a support for supporting a substrate thereon and a expansion mechanism for moving said support horizontally, and wherein said transfer means, in cooperation with said lift pins of said substrate holding means, is adapted to transfer the substrate to or from said substrate holding means.

8. A substrate conveyance system as claimed in claim 1, wherein on each of said first transfer module and said second transfer module includes substrate detecting means for detecting presence or absence of a substrate.

9. A substrate conveyance system as claimed in claim 8, further comprising control means for remotely controlling driving of said transfer means and orientation changes of said substrate holding means in accordance with a signal sent from said detecting means.

10. A substrate conveyance system as claimed in claim 1, wherein said substrate destination is a cluster-tool type substrate processing apparatus.

* * * * *